(12) United States Patent
Parker et al.

(10) Patent No.: US 6,777,675 B2
(45) Date of Patent: Aug. 17, 2004

(54) DETECTOR OPTICS FOR ELECTRON BEAM INSPECTION SYSTEM

(75) Inventors: N. William Parker, Fairfield, CA (US);
Edward M. Yin, Cupertino, CA (US);
Frank Ching-Feng Tsai, Saratoga, CA (US)

(73) Assignee: Multibeam, Santa Clara, CA (US)

( * ) Notice: Subject to any disclaimer, the term of this patent is extended or adjusted under 35 U.S.C. 154(b) by 0 days.

(21) Appl. No.: 10/126,943

(22) Filed: Apr. 18, 2002

(65) Prior Publication Data

US 2002/0153483 A1 Oct. 24, 2002

Related U.S. Application Data

(60) Provisional application No. 60/338,579, filed on Apr. 18, 2001.

(51) Int. Cl.[7] .............................................. H01J 37/244
(52) U.S. Cl. ...................................................... 250/310
(58) Field of Search ................................ 250/310, 397

(56) References Cited

U.S. PATENT DOCUMENTS 4,011,450 A * 3/1977 Tagawa et al. ............. 250/311
5,578,822 A * 11/1996 Van Der Mast et al. .... 250/310
5,717,204 A * 2/1998 Meisburger et al. ........ 250/310
6,236,053 B1  5/2001 Shariv ........................ 250/397

* cited by examiner

Primary Examiner—John R. Lee
Assistant Examiner—Phillip Johnston
(74) Attorney, Agent, or Firm—David Jaffer; Pillsbury Winthrop

(57) ABSTRACT

An electron beam column incorporating an asymmetrical detector optics assembly provides improved secondary electron collection. The electron beam column comprises an electron gun, an accelerating region, scanning deflectors, focusing lenses, secondary electron detectors and an asymmetrical detector optics assembly. The detector optics assembly comprises a field-free tube, asymmetrical with respect to the electron optical axis; the asymmetry can be introduced by offsetting the field-free tube from the electron optical axis or by chamfering the end of the tube. In other embodiments the detector optics assembly comprises a field-free tube and a voltage contrast plate, either or both of which are asymmetrical with respect to the electron optical axis.

19 Claims, 9 Drawing Sheets

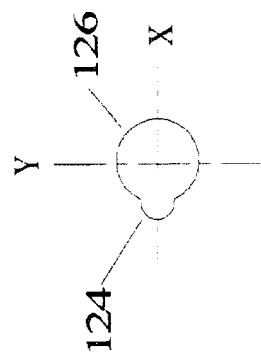
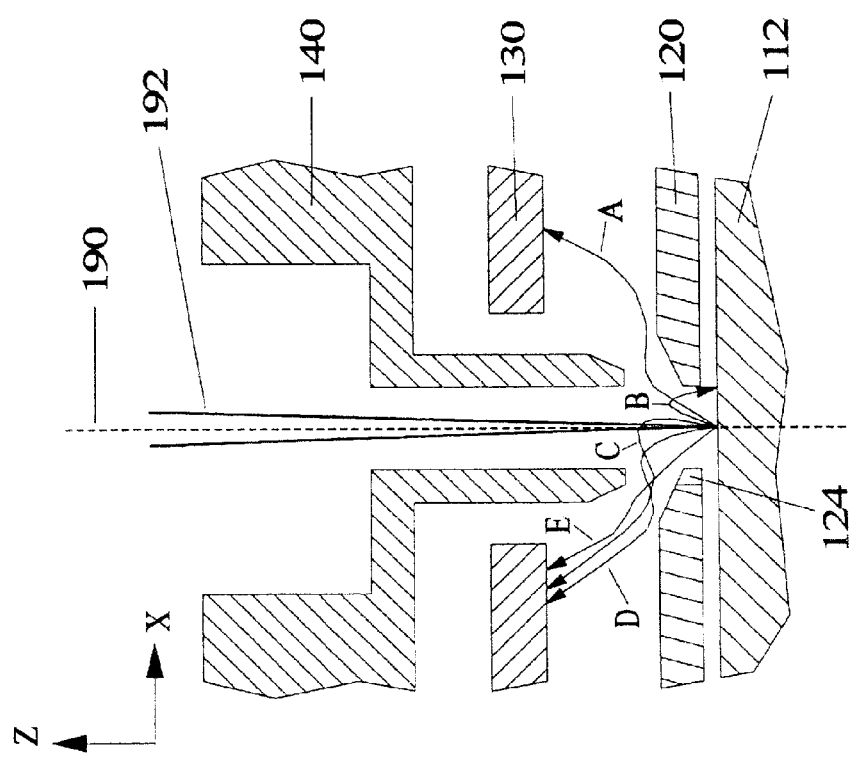
FIG. 6B
FIG. 6A

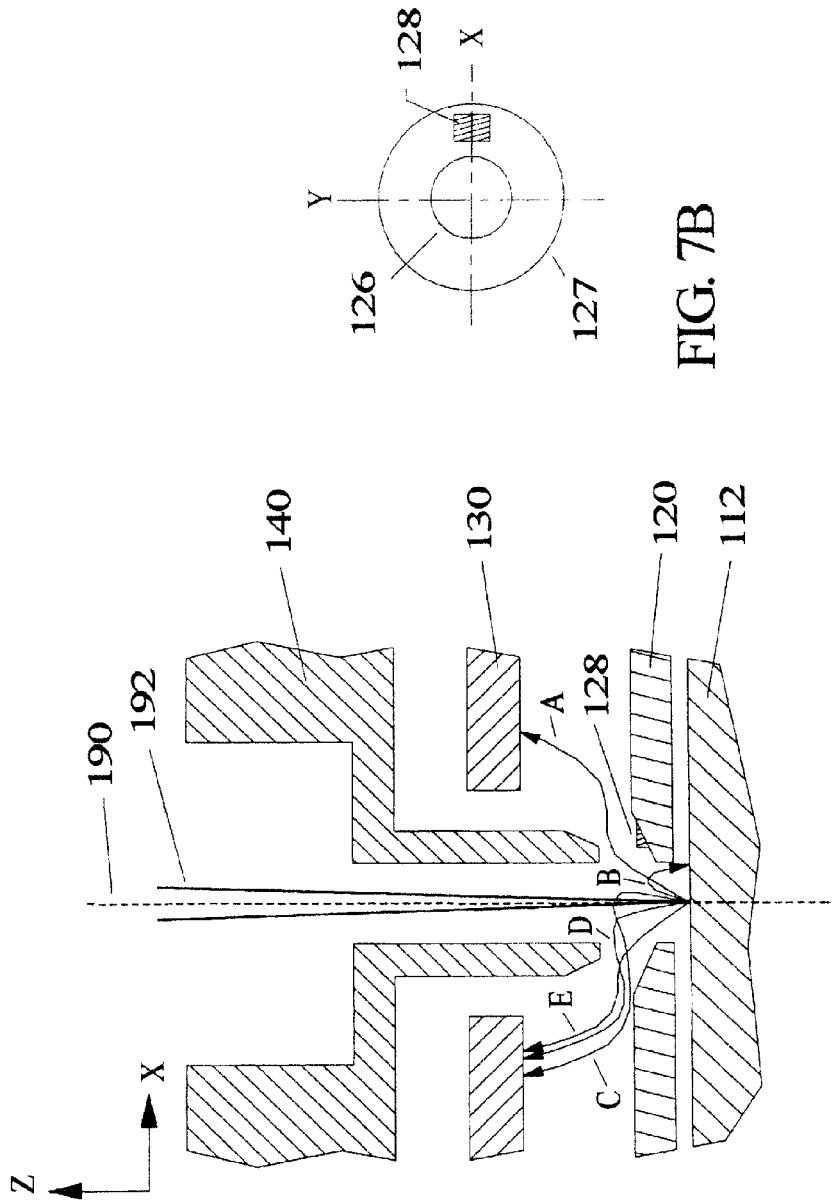

DETECTOR OPTICS FOR ELECTRON BEAM INSPECTION SYSTEM

CROSS-REFERENCE TO RELATED APPLICATIONS

This application claims the benefit of U.S. Provisional Application No. 60/338,579 filed Apr. 18, 2001.

BACKGROUND OF THE INVENTION

1. Field of the Invention

This invention relates to the field of electron optics, and in particular to electron optics components for a semiconductor wafer and mask defect inspection system.

2. Description of the Related Art

Electron optical systems employed for imaging purposes typically generate a "primary" electron beam which is focused onto the surface of a substrate by probe-forming electron optics. The imaging process typically involves the collection of "secondary" electrons which are emitted from the substrate surface as a result of the interaction of the primary electron beam with the substrate surface. In electron optical imaging systems, the energy of the primary electron beam is generally at least several hundred eV, while the secondary electron energies are predominantly below 10 eV. In order to form an image of the substrate, it is necessary to separate the secondary electrons from the primary electrons and collect these secondary electrons with some type of detector. In many electron optical systems, the secondary electron detector is positioned within the probe-forming optics, and a crossed magnetic-electric field filter (commonly called a "Wien" filter) is used to deflect the secondary electrons off-axis into a detector, while simultaneously allowing the primary electrons (which are moving in the opposite direction), to pass through the Wien filter undeflected. In other electron optical systems, the secondary electron detector is positioned below the probe-forming optics, and off to one side of the electron optical axis of the probe-forming optics. In these systems, it is necessary that the electric fields from the secondary electron detector do not substantially affect the primary electron beam. This requirement typically limits the secondary electron collection efficiencies of these imaging systems. In systems where the primary electron beam energy is low, such as electron beam inspection systems, achieving high secondary electron collection efficiencies is particularly demanding. Clearly, there is a need for improved detector electron optics.

SUMMARY OF THE INVENTION

This invention includes an electron beam column incorporating an asymmetrical detector optics assembly. According to aspects of the invention, the electron beam column comprises: a probe optics assembly, for forming an electron probe; an electron optical axis, defined by the probe optics assembly; a secondary electron detector situated below the probe optics assembly; and a detector optics assembly, asymmetrical with respect to the electron optical axis, situated below the probe optics assembly. In preferred embodiments, the detector optics assembly comprises a field-free tube, asymmetrical with respect to the electron optical axis, situated between the probe optics assembly and the secondary electron detectors; the asymmetry can be introduced by offsetting the field-free tube from the electron optical axis or by chamfering the end of the tube. In some embodiments, the field-free tube has a circular bore and a square perimeter. In some embodiments the detector optics assembly comprises a field-free tube and a voltage contrast plate, either or both of which are asymmetrical with respect to the electron optical axis; the voltage contrast plate is situated below the field free tube and the secondary electron detectors. Asymmetry can be introduced for the voltage contrast plate by offsetting the plate from the electron optical axis, or by introducing notches or bumps onto the aperture in the plate. Some embodiments may include components of the detector optics assembly in which asymmetry has been introduced in multiple ways. The electron beam column may further comprise a stage situated below the detector optics assembly. The probe optics assembly comprises: an electron gun; an accelerating region situated below the electron gun; scanning deflectors situated below the accelerating region; and focusing lenses situated below the deflectors.

BRIEF DESCRIPTION OF THE FIGURES

FIG. 6A shows a cross-sectional representation of detector optics with a voltage contrast plate having a notch on the inner aperture circumference.

FIG. 6B shows a plane view of a voltage contrast plate having a notch on the inner aperture circumference.

FIG. 7A shows a cross-sectional representation of detector optics with a voltage contrast plate having a bump on the beveled inner surface.

FIG. 7B shows a plane view of a voltage contrast plate having a bump on the beveled inner surface.

DETAILED DESCRIPTION

The invention disclosed herein is a detector optics structure for an electron beam column. The detector optics components can be fabricated on a millimeter scale, and are consequently well suited for millimeter scale electron beam columns (typically comprised of electrostatic lenses, rotators, deflectors, etc.). Such millimeter scale electron beam columns can be combined to comprise the imaging part of a multi-beam multi-column electron beam inspection system for the semiconductor industry (where multiple columns must fit over a semiconductor wafer or mask). The details of such a multi-beam multi-column electron beam inspection system are found in U.S. application Ser. No. 09/789,180 and PCT Application No. PCT/US01/05338, incorporated by reference herein.

Figure 1:
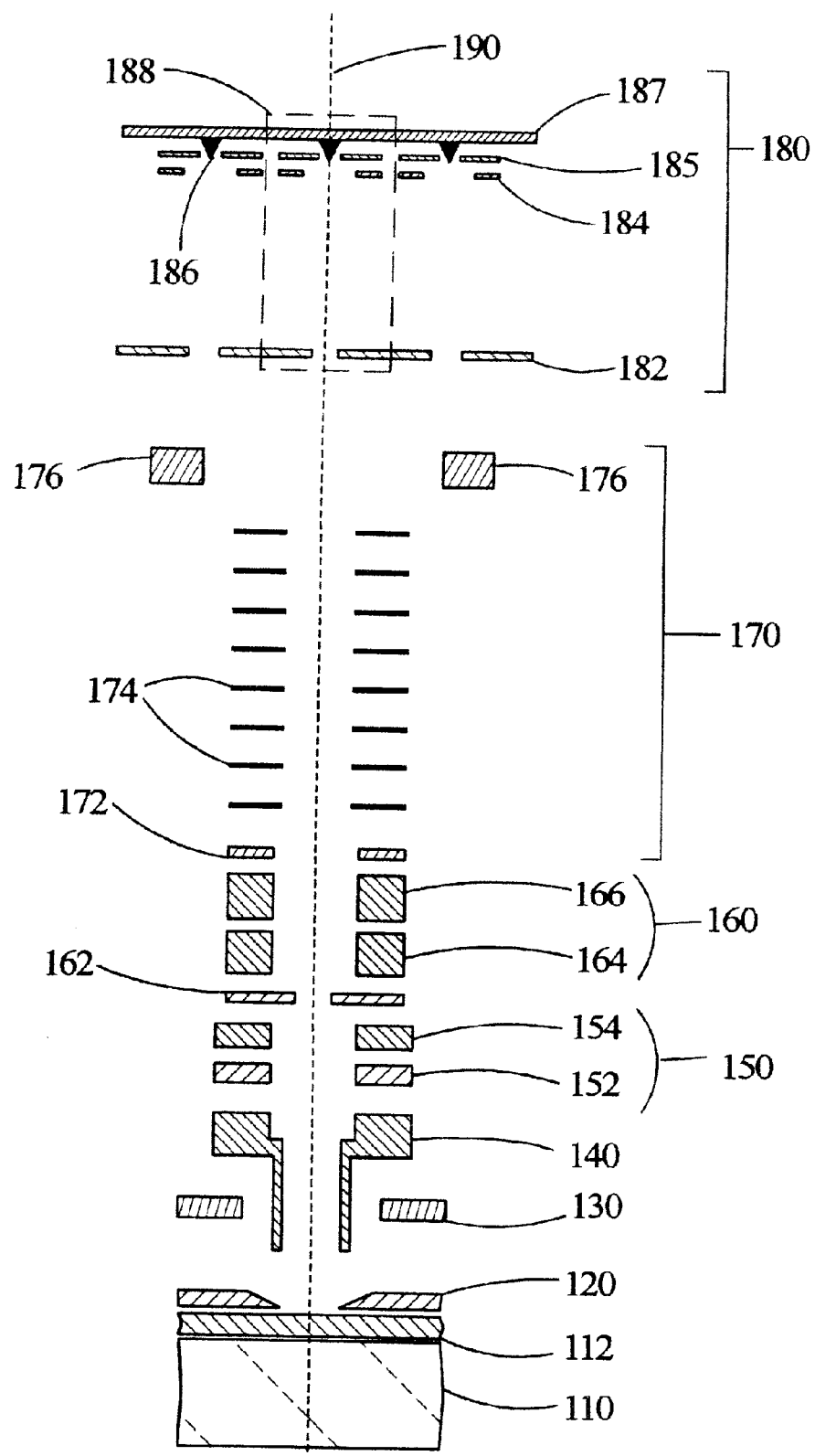
FIG. 1 shows a schematic cross-sectional representation of an electron optical column.

A schematic cross-sectional representation of a single electron beam column, suitable for use in a multi-column electron beam inspection system, is shown in FIG. 1; a detailed description of this electron beam column can be found in U.S. application Ser. No. 09/789,180 and PCT Application No. PCT/US01/05338. In FIG. 1, stage 110, wafer 112, voltage contrast plate 120, secondary electron (SE) detectors 130, field-free tube 140, focusing lenses 150, focusing lens 2 152, focusing lens 1 154, scanning deflectors 160, blanking aperture 162, subfield deflector 164, mainfield deflector 166, accelerating region 170, shield electrode 172, accelerating plates 174, alignment deflector 176, electron gun 180, beam limiting aperture 182, focus electrode 184, gate electrodes 185, field emitting tips 186, source substrate 187, electron source 188, and electron optical axis 190 are shown.

A simplified explanation of the electron optical column operation is as follows. The electron gun 180 creates a narrow, focused electron beam. The beam limiting aperture 182 defines the electron beam semi-angle, which is the electron optical equivalent to the numerical aperture (N.A.) of a light optical system. The alignment deflector 176 precisely steers the beam down the center of the column (along the electron optical axis 190). The electron beam is accelerated to high energy through the accelerating region 170. The focusing lenses 150 focus the beam to a small spot on the wafer 112 while the scanning deflectors 160 scan the beam over the wafer 112 in a raster scan. The secondary electrons created by the primary beam are captured by the SE detectors 130.

The combination of focusing lenses 150, scanning deflectors 160, accelerating region 170, electron gun 180, and related components is referred to as the probe optics assembly.

Note that the components in FIG. 1 are not drawn to scale; for example, in a preferred embodiment, each column is roughly 160 mm in length, with the majority of the length represented by the accelerating region 170 between the electron gun 180 and the deflectors 160. The electron gun 180 shown in FIG. 1 is a preferred embodiment; it comprises a plurality of field emission electron sources 188; for purposes of clear illustration, only 3 sources 188 are shown. Various other electron guns can be used including those with arrays of electron sources or single sources; some examples of more typical single sources are single crystal tungsten thermal emitters and Schottky emitters.

Figure 2:
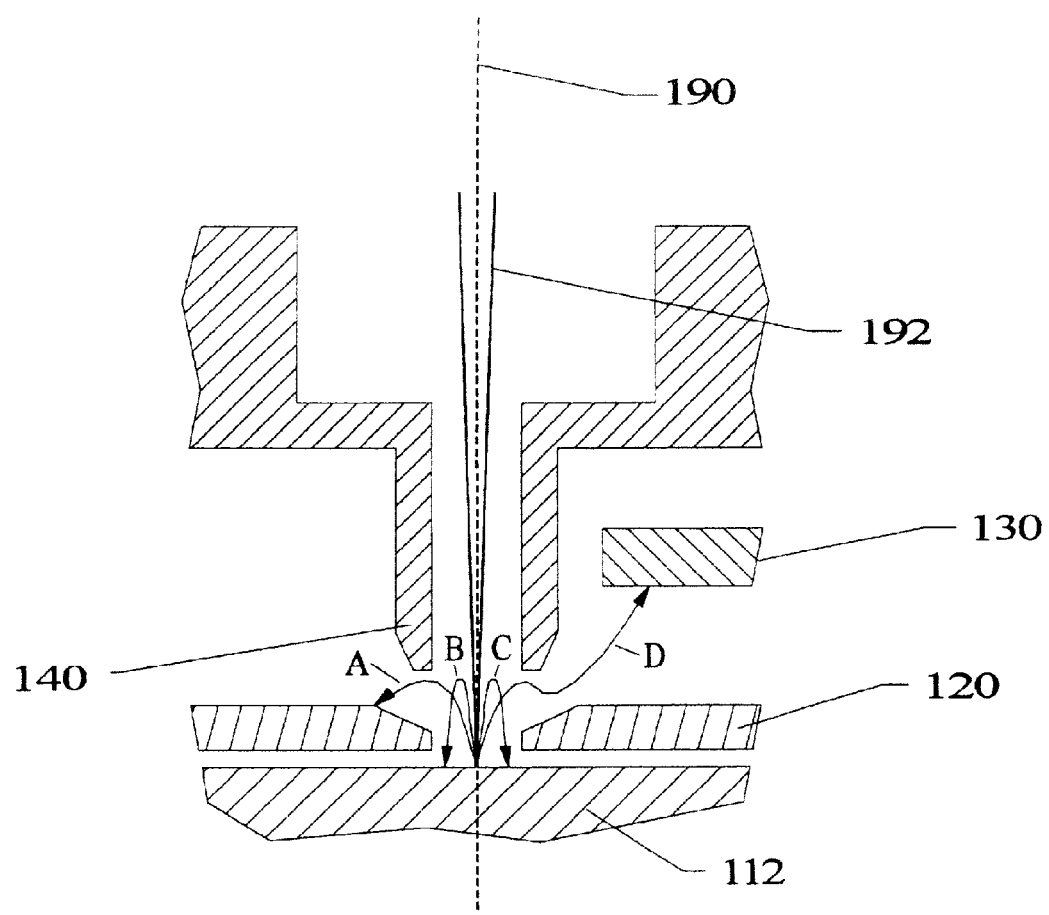
FIG. 2 shows a cross-sectional representation of symmetrical detector optics.

The lower end of the electron beam column of FIG. 1 is shown in FIG. 2; further details of the symmetrical detector optics shown in FIG. 2 can be found in U.S. application Ser. No. 09/789,180 and PCT Application No. PCT/US01/05338. In FIG. 2, wafer 112, voltage contrast plate 120, secondary electron (SE) detectors 130, field-free tube 140, electron optical axis 190, electron probe 192, and secondary electron (SE) trajectories A, B, C & D are shown.

The combination of voltage contrast plate 120 and field-free tube 140 are referred to as the detector optics assembly. In brief, the detector optics design and configuration is optimized to give good secondary electron collection efficiency, while minimizing perturbation of the electron probe 192 by the secondary electron detectors 130. A more detailed discussion of the detector optics components follows.

The field-free tube 140 is held at a potential that is slightly lower than that of the wafer 112. The purpose of the field-free tube 140 is to separate the secondary electrons (emitted from the wafer surface) from the primary electrons (in the electron probe 192). Typically, secondary electrons have an energy range that is less than 10 eV and primary electrons have an energy of 1 keV (typical for wafer or mask inspection), both relative to the wafer. As the secondary electrons are emitted from the surface, they travel towards the field-free tube 140; however, the secondary electrons have insufficient energy to enter the field-free tube 140 because of a negative, typically 20 V, potential difference between the field-free tube 140 and the wafer 112. Thus, the secondary electrons will be pushed away from the field-free tube 140 and attracted to the SE detectors 130.

The voltage contrast plate 120 has two functions: (1) enhance secondary electron collection efficiency and (2) allow for voltage contrast imaging of the wafer surface. The voltage contrast plate 120 is held a very short distance above the wafer 112 (roughly 100 µm in a preferred embodiment). The voltage contrast plate 120 has a small (typically 1 mm) aperture through which the primary and secondary electrons travel. The sides of the aperture are beveled at a typical angle of $\arctan(1/\sqrt{2})$ with respect to the wafer surface, so as to assist in creating a field-free region on the wafer surface when the voltage contrast plate 120 is held at a potential very close to that of the wafer 112. This field-free region near the wafer 112 is necessary to prevent the extraction of excessive numbers of secondary electrons from the wafer 112, which would tend to cause positive charging of the wafer surface. Alternatively, the voltage contrast plate 120 can be operated as an electron energy high pass filter, blocking lower energy secondary electrons and allowing higher energy secondary electrons to reach the SE detectors 130.

The SE detectors 130 are positioned between the field-free tube 140 and the wafer 112. A single detector, as shown in FIG. 2, may be used; preferred embodiments include a uniform annular detector, or a multi-sectored detector. A multi-sectored detector can detect topographical information by adding angular information to the detected signal. In one preferred embodiment of the present invention, the SE detector 130 is a four-quadrant detector and is held at a potential of roughly 5 kV.

Consider the secondary electron trajectories shown in FIG. 2: some secondary electrons, following trajectories such as A, strike a surface and are lost to the SE detector 130; other secondary electrons, which leave nearly perpendicular to the wafer surface, are reflected back to the wafer 112 by the field-free tube 140, as illustrated by trajectories B & C: a fraction of the secondary electrons follow trajectories such as D which reach the SE detector 130. Despite the careful design of the detector optics assembly, as described above, the collection efficiency of secondary electrons is lower than may be desired.

Figure 3:
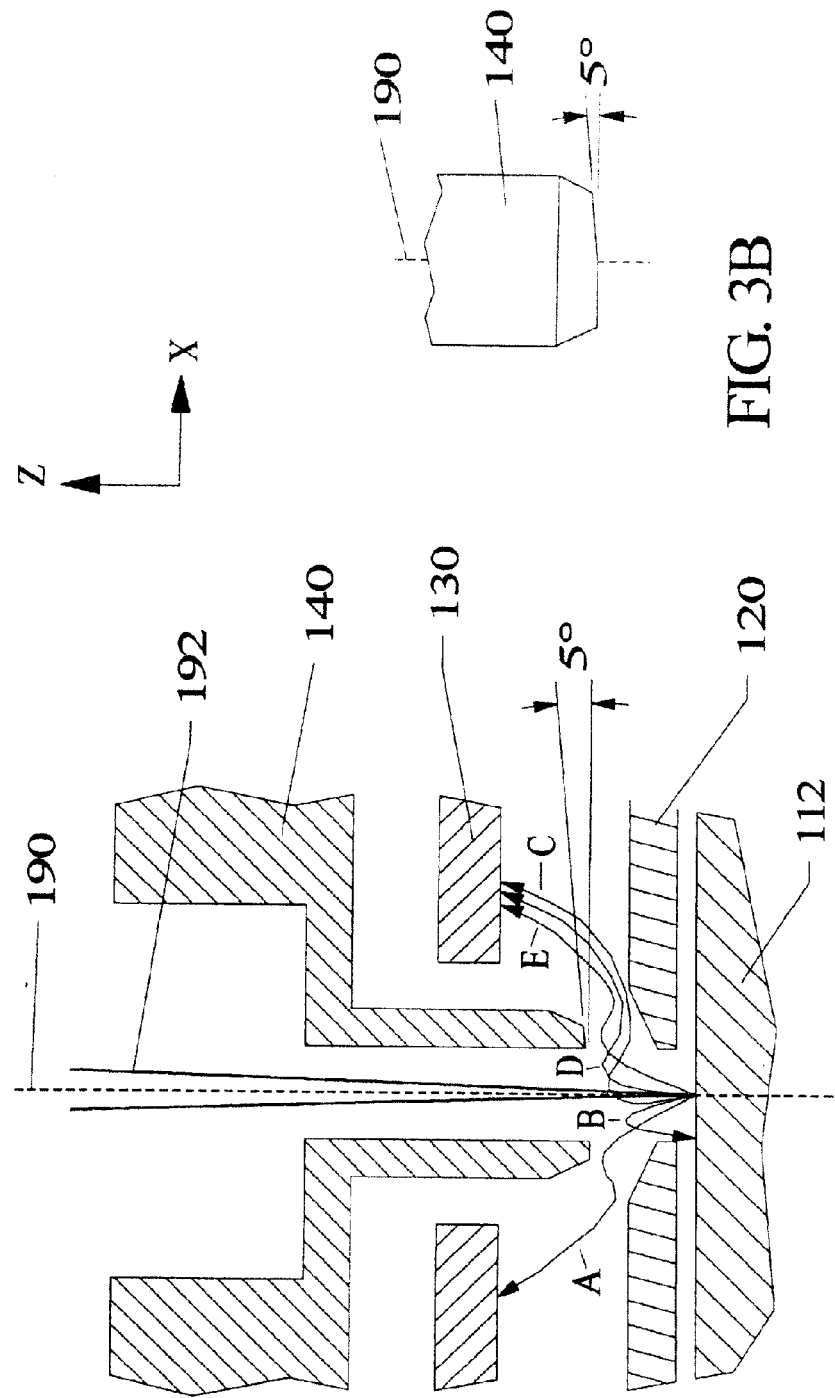
FIG. 3A shows a cross-sectional representation of detector optics with a chamfered field-free tube.
FIG. 3B shows a side view of a chamfered field-free tube.

FIGS. 3A & 3B show an asymmetrical detector optics of this invention. In FIG. 3A, wafer 112, voltage contrast plate 120, secondary electron (SE) detectors 130, field-free tube 140, electron optical axis 190, electron probe 192, and secondary electron (SE) trajectories A, B, C, D & E are shown. In FIG. 3B, field-free tube 140 and electron optical axis 190 are shown. A chamfer is shown on the lower end of the field-free tube 140; in the example shown in FIGS. 3A & 3B the chamfer is a surface at approximately 5 degrees to the X-Y plane, extending from a diameter (parallel to the Y direction) to the perimeter of the end of the tube. The exact angle and extent of the chamfer will depend on the desired performance of the detector optics; however, any such modification of the field-free tube 140 serves to break the cylindrical symmetry. This chamfer allows the SE detectors' electric field to affect the region surrounding the electron optical axis 190 and just above the wafer 112. Now, secondary electrons which leave nearly perpendicular to the wafer surface follow trajectories such as C & D and reach the SE detector 130; however there are still a small fraction of secondary electrons which do not reach the SE detectors 130, as shown by trajectory B. Modeling of the secondary electron collection efficiency shows that there is a significant improvement for the asymmetrical detector optics of this invention over the cylindrically symmetric detector optics. Note that the electric field on the electron optical axis 190, between the lower end of field-free tube 140 and the wafer 112, should be strong enough to improve the secondary electron detection efficiency, and yet not too strong to distort the primary electron beam (electron probe 192).

Figure 4:
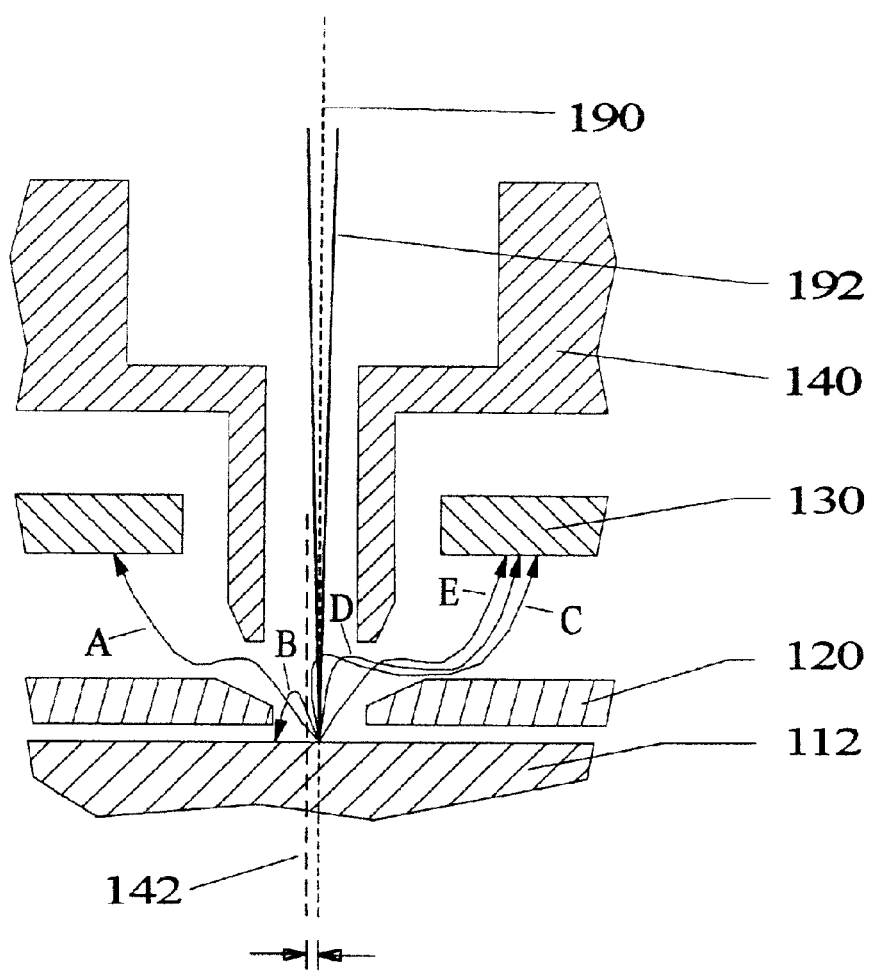
FIG. 4 shows a cross-sectional representation of detector optics with an offset field-free tube.

FIG. 4 shows another embodiment of the asymmetrical detector optics of this invention. In FIG. 4, wafer 112, voltage contrast plate 120, secondary electron (SE) detectors 130, field-free tube 140, field-free tube axis 142, electron optical axis 190, electron probe 192, and secondary electron (SE) trajectories A, B, C, D & E are shown. The field-free tube 140 is shown offset from the electron optical axis 190, such that the field-free tube axis 142 is offset, but parallel to the electron optical axis 190. As illustrated by the secondary electron trajectories A, B, C, D and E, the effect of moving the field-free tube 140 slightly off the electron optical axis 190 gives a similar result to that of chamfering the field-free tube, as shown in FIGS. 3A & 3B.

Figure 5:
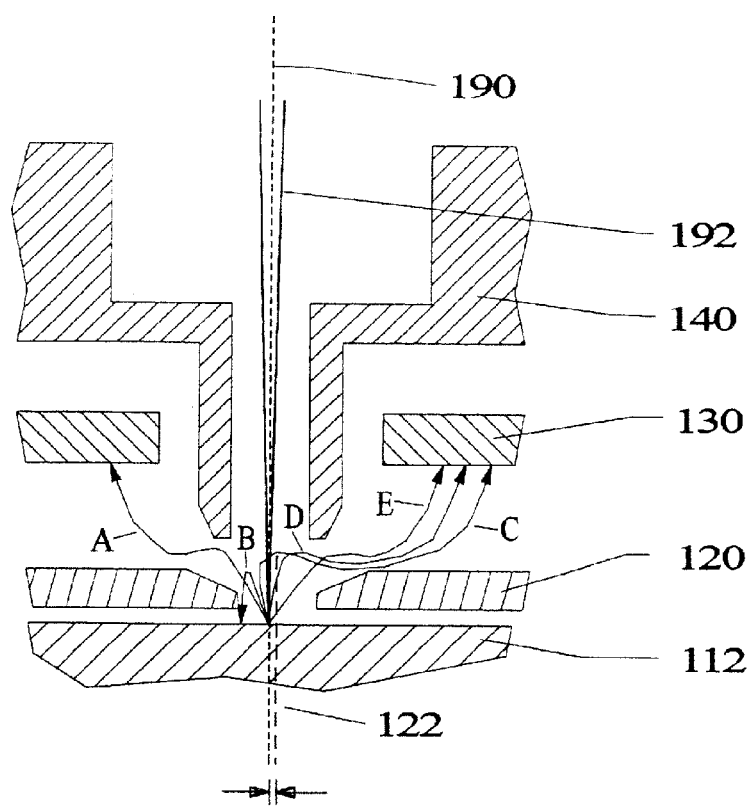
FIG. 5 shows a cross-sectional representation of detector optics with an offset voltage contrast plate.

FIG. 5 shows a further embodiment of the asymmetrical detector optics of this invention. In FIG. 5, wafer 112, voltage contrast plate 120, voltage contrast plate axis 122, secondary electron (SE) detectors 130, field-free tube 140, electron optical axis 190, electron probe 192, and secondary electron (SE) trajectories A, B, C, D & E are shown. The voltage contrast plate 120 is shown offset from the electron optical axis 190, such that the voltage contrast plate axis 122 is offset, but parallel to the electron optical axis 190. The effect of offsetting the voltage contrast plate 120 on secondary electron trajectories A, B, C, D & E is very similar to that for offsetting the field-free tube 140, as shown in FIG. 4.

FIGS. 6A & 6B show another embodiment of the asymmetrical detector optics of this invention. In FIG. 6A, wafer 112, voltage contrast plate 120, voltage contrast plate notch 124, secondary electron (SE) detectors 130, field-free tube 140, electron optical axis 190, electron probe 192, and secondary electron (SE) trajectories A, B, C, D & E are shown. In FIG. 6B, voltage contrast plate notch 124 and voltage contrast plate inner aperture 126 are shown. Note that secondary electron trajectories are deflected toward the notch 124 in voltage contrast plate 120.

FIG. 7 shows a further embodiment of the asymmetrical detector optics of this invention. In FIG. 7A, wafer 112, voltage contrast plate 120, voltage contrast plate notch 124, secondary electron (SE) detectors 130, field-free tube 140, electron optical axis 190, electron probe 192, and secondary electron (SE) trajectories A, B, C, D & E are shown. In FIG. 7B, voltage contrast plate inner aperture 126, voltage contrast plate beveled inner surface circumference 127, and voltage contrast plate bump 128 are shown. Note that secondary electron trajectories are deflected away from the bump 128 on voltage contrast plate 120.

Figure 8A:
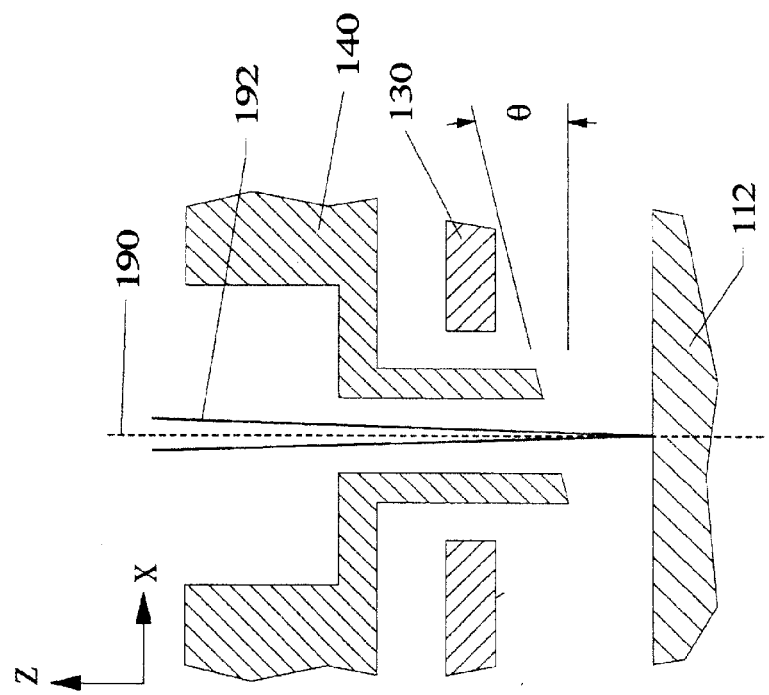
FIG. 8A shows a cross-sectional representation of detector optics with a chamfered field-free tube and without a voltage contrast plate.
Figure 8B:
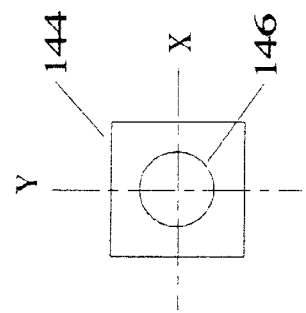
FIG. 8B shows a cross-sectional representation of a field-free tube with square perimeter.

FIG. 8 shows an embodiment of the invention where the detector optics has no voltage contrast plate. In FIG. 8A, wafer 112, secondary electron (SE) detectors 130, field-free tube 140, electron optical axis 190, and electron probe 192 are shown. In FIG. 8B, field-free tube square perimeter 144 and field-free tube bore circumference 146 are shown. A chamfer is shown on the lower end of the field free tube 140; in the example shown in FIGS. 8A & 8B the chamfer is a surface at approximately 30 degrees to the X-Y plane, extending across the entire lower end of the tube. Further, as shown in the cross-section parallel to the X-Y plane (FIG. 8B), this particular embodiment has a field free tube 140 with a square perimeter 144. Having no voltage contrast plate results in a larger vertical component (parallel to the electron optical axis 190) of the electric field at the surface of the wafer 112; this increases the collection efficiency for secondary electrons emitted at angles very close to the plane of the wafer surface. Note that the effect of the square perimeter 144 is to shepherd the secondary electrons away from the corners of the square; this may be of use in directing the secondary electrons to strategically placed secondary electron detectors 130. The orientation of the square perimeter 144 in the X-Y plane is shown in FIG. 8B; this orientation can be changed to optimize secondary electron collection, depending on the position of the SE detectors 130. The combined effect of the chamfered field-free tube 140 and the square perimeter 144 can be optimized for certain applications by aligning the chamfer along the diagonal of the square (this would be the case if the square in FIG. 8B is rotated through 45 degrees from what is shown).

There are many embodiments of this invention, including detector optics with the following modifications: various chamfers, cuts or bevels can be introduced into the end of the field-free tube or the voltage contrast plate; notches can be cut in the field-free tube or the voltage contrast plate; bumps can be added to these components; these components can be offset from the electron optical axis; basically, any modification that introduces enough asymmetry to the electric field so as to improve the collection efficiency of secondary electrons. More than one modification can be combined to effect; an example of a combination of modified components is shown in FIGS. 9A & 9B.

Figures 9A, 9B:
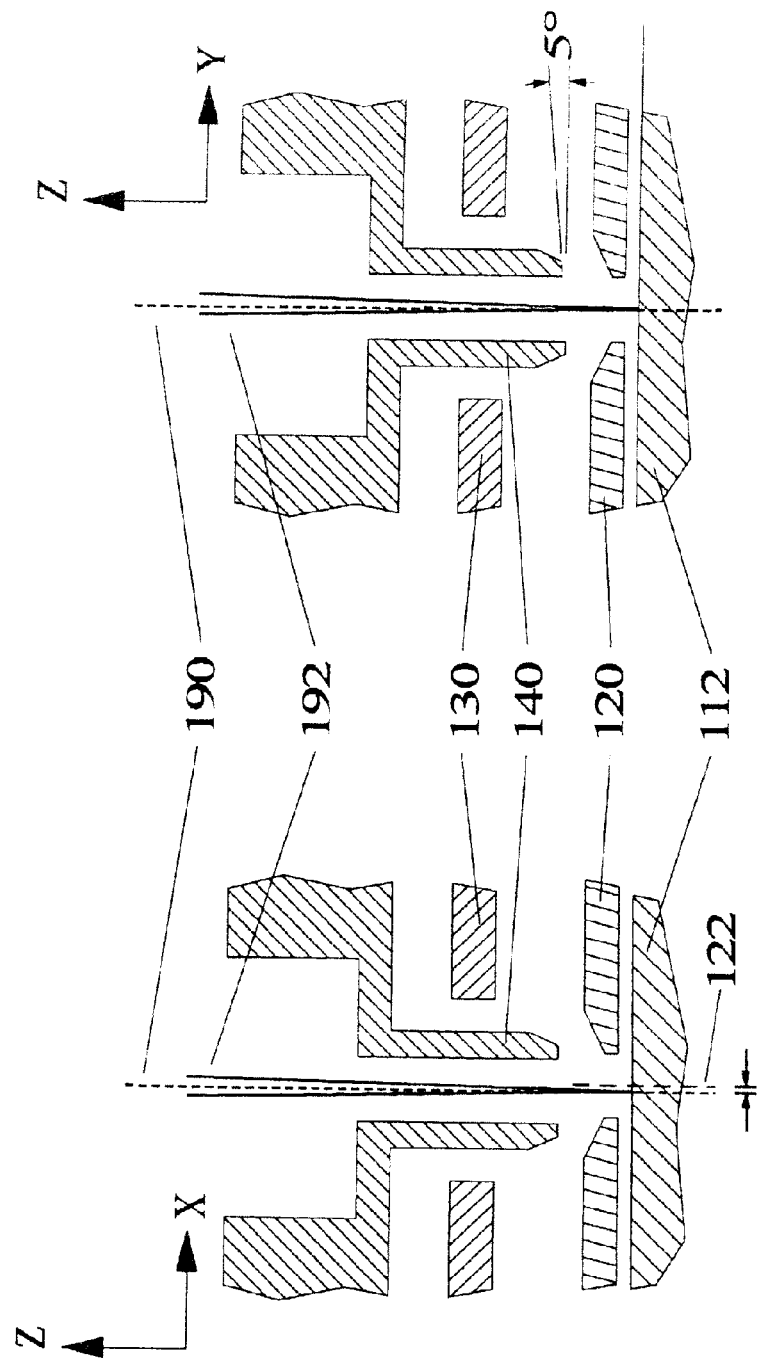
FIG. 9A shows a cross-sectional representation of detector optics with an offset voltage contrast plate, in combination with a chamfered field-free tube.
FIG. 9B shows a cross-sectional representation of detector optics with a chamfered field-free tube, in combination with an offset voltage contrast plate.

FIGS. 9A & 9B show schematic cross sections in the X-Z and Y-Z planes, respectively. The offset of the voltage contrast plate 120 is evident in FIG. 9A and the chamfer on the end of the field-free tube 140 is evident in FIG. 9B. In FIGS. 9A and 9B wafer 112, voltage contrast plate 120, secondary electron (SE) detectors 130, field-free tube 140, electron optical axis 190, and electron probe 192 are shown. In FIG. 9A, voltage contrast plate axis 122 is also shown.

Most of the discussion above has considered the secondary electron collection efficiency. The asymmetrical detector optics assemblies of this invention can also be used to decrease the transit time of secondary electrons from the wafer to the SE detectors.

Most of the components of the detector optics assembly can be fabricated by precision-machining vacuum compatible metals, insulating ceramics and conductive ceramics. Standard mechanical and optical alignment techniques are utilized to ensure that all components are properly situated.

While the invention has been described with reference to particular embodiments, this description is solely for the purpose of illustration and is not to be construed as limiting the scope of the invention claimed below. For example, the asymmetrical detector optics assembly of the invention can be integrated into a variety of electron beam columns, including columns with magnetic lenses. The asymmetrical detector optics assembly of this invention can be incorporated into a variety of systems, including electron microscopes and other analytical systems.

What is claimed is:

1. An electron beam column comprising:
a probe optics assembly, for forming an electron probe;

an electron optical axis, defined by said probe optics assembly;

a secondary electron detector situated below said probe optics assembly; and a detector optics assembly, generally cylindrically symmetric about said electron optical axis, situated below said probe optics assembly;

wherein at least one component of said detector optics assembly is configured to break said cylindrical symmetry.

2. An electron beam column as in claim 1, wherein said detector optics assembly comprises a field free tube, configured to break said cylindrical symmetry, situated between said electron probe and said secondary electron detector.

3. An electron beam column as in claim 2, wherein said detector optics assembly further comprises a voltage contrast plate situated below said field free tube and said secondary electron detector.

4. An electron beam column as in claim 1, wherein said detector optics assembly comprises a voltage contrast plate, configured to break said cylindrical symmetry, situated below said secondary electron detector.

5. An electron beam column as in claim 4, wherein said detector optics assembly further comprises a field free tube situated between said electron probe and said secondary electron detector and above said voltage contrast plate.

6. An electron beam column as in claim 2, wherein said detector optics assembly further comprises a voltage contrast plate, also configured to break said cylindrical symmetry, situated below said field free tube and said secondary electron detector.

7. An electron beam column as in claim 2, wherein said field free tube has a chamfered lower end.

8. An electron optical column as in claim 7, wherein said field free tube has a circular bore and a square perimeter.

9. An electron beam column as in claim 2, wherein said field free tube is offset from said electron optical axis.

10. An electron optical column as in claim 4, wherein said voltage contrast plate is offset from said electron optical axis.

11. An electron optical column as in claim 4, wherein said voltage contrast plate has a notch in the aperture.

12. An electron optical column as in claim 4, wherein said voltage contrast plate has a bump on the aperture.

13. An electron optical column as in claim 6, wherein said field free tube has a chamfer on the lower end and said voltage contrast plate is offset from said electron optical axis.

14. An electron beam column as in claim 1, further comprising a stage situated below said detector optics assembly and said secondary electron detector.

15. An electron beam column as in claim 1, wherein said probe optics assembly comprises:

an electron gun;

an accelerating region situated below said electron gun;

scanning deflectors situated below said accelerating region; and focusing lenses situated below said deflectors.

16. An electron beam column comprising:

a probe optics assembly, for forming an electron probe;

an electron optical axis, defined by said probe optics assembly;

a secondary electron detector situated below said probe optics assembly; and a field free tube with a chamfered lower end, situated between said probe optics assembly and said secondary electron detector.

17. An electron beam column as in claim 16, wherein said probe optics assembly comprises:

an electron gun;

an accelerating region situated below said electron gun;

scanning deflectors situated below said accelerating region; and focusing lenses situated below said deflectors.

18. An electron beam column comprising:

a probe optics assembly, for forming an electron probe;

an electron optical axis, defined by said probe optics assembly;

a secondary electron detector situated below said probe optics assembly;

a field free tube with a chamfered lower end, situated between said probe optics and said secondary electron detector; and a voltage contrast plate offset from said electron optical axis, situated below said field free tube and said secondary electron detector.

19. An electron beam column as in claim 18, wherein said probe optics assembly comprises:

an electron gun;

an accelerating region situated below said electron gun;

scanning deflectors situated below said accelerating region; and focusing lenses situated below said deflectors.

* * * * *